(12) United States Patent
Ball

(10) Patent No.: US 7,521,630 B2
(45) Date of Patent: Apr. 21, 2009

(54) PARALLEL AND VIRTUAL PARALLEL INTERCONNECTION OF SOLAR CELLS IN SOLAR PANELS

(76) Inventor: Newton E. Ball, c/or Fuess & Davidenas, 10951 Sorrento Valley Rd., San Diego, CA (US) 92121-1613

( * ) Notice: Subject to any disclaimer, the term of this patent is extended or adjusted under 35 U.S.C. 154(b) by 55 days.

(21) Appl. No.: 11/713,297

(22) Filed: Mar. 1, 2007

(65) Prior Publication Data

US 2008/0210286 A1 Sep. 4, 2008

(51) Int. Cl.
H01L 31/042 (2006.01)
(52) U.S. Cl. ........ 136/244; 136/293
(58) Field of Classification Search ......... 136/243–265, 136/290–293
See application file for complete search history.

(56) References Cited

FOREIGN PATENT DOCUMENTS

JP 05-003628 * 1/1993
JP 2002-10520 * 1/2002

OTHER PUBLICATIONS

Website "GLREA: Articles: How Do Solar Panels Work?", http://www.glrea.org/articles/howDoSolarPanelsWork.html from Oct. 15, 2004, available from www.archive.org. 5 pages.*

* cited by examiner

Primary Examiner—Nam X Nguyen
Assistant Examiner—Jeffrey T Barton
(74) Attorney, Agent, or Firm—Jerry Turner Sewell

(57) ABSTRACT

A solar panel has n rows of solar cells in a regular grid array. The cells constituting each row are wired in parallel, the rows are wired in series and an equalizing network of n-1 capacitors are connected in electrical series. In a first configuration, a network of switches connects a first capacitor across the first row, and a second capacitor across the second row, and so on until the n-1th capacitor is connected across the cells of the n-1th row. In a second configuration, the switch network connects the first capacitor across the second row, and the second capacitor across the third row, and so on until the n-1th capacitor is connected across the nth row. This causes the voltage across each row to be substantially equal to the voltage across every other row. Since equal voltage is a hallmark of parallel connection, this voltage equalized series connection is referred to as a virtual parallel connection.

15 Claims, 4 Drawing Sheets

PARALLEL AND VIRTUAL PARALLEL INTERCONNECTION OF SOLAR CELLS IN SOLAR PANELS

BACKGROUND OF THE INVENTION

1. Field of the Invention

The present invention has to do with and relates to the general field of photovoltaic solar cells and solar panels, and more particularly to the electrical interconnection of arrayed solar cells within solar panels in which individual solar cells may be from time to time shaded or physically obscured in order to produce electrical power from sunlight.

The present invention particularly concerns the electrical connection of solar cells arrayed in a solar panel so that the electrical power output of the solar panel may be more substantially maintained notwithstanding that individual solar cells may be from time to time shaded, and produce less current and less power while so obscured.

2. Background of the Invention

Photovoltaic arrays of solar cells, principally made from silicon, are increasingly used as a low maintenance source of clean energy, emitting zero pollution of any kind. This source produces electrical energy, a thermodynamically "high" energy form, and is inexhaustibly renewable.

Photovoltaic arrays presently in common use typically involve electrical series connection of low voltage solar cells. In this electrical series connection, if one cell is obscured by shadow or physical matter such as avian defecation, it will produce a lower current than an unblocked cell. The entire series string can only produce current in the amount that is available from the obscured or shaded cell. The present invention greatly ameliorates this problem.

SUMMARY OF THE INVENTION

The present invention contemplates a new electrical connection of solar cells that are arrayed in solar panels, including such solar panels as are themselves massively arrayed in large area "photovoltaic farms". The new electrical connection is such that adverse effects on power output of a solar panel due to shadows or physical deposits on some of the solar cells of the solar panel are minimized.

In particular, rather than permitting the partial obstruction of some arrayed solar cells of a solar panel to cause the current output of the entire solar panel to fall to the low current being produced by the one or more shadowed or blocked solar cells of the array, the electrical connection of the present invention makes that the solar panel will still produce substantially full current. This current is reduced only slightly by those solar cells of the panel and of the array—normally but a small percentage of the overall solar cells—that are at any one time shaded or obstructed, and that thus produce a lower current output.

Moreover, this substantial avoidance of the negative impact of partial obscuring of a solar panel is realized without adopting the simple expedient of connecting all the solar cells of the solar panel in electrical parallel, Such a full parallel electrical connection while also alleviating negative effects on power output from partial obscuring produces currents that are unwieldy large to be handled per the state of semiconductor development circa 2006. For example, a 1 kilowatt system with all cells in parallel would produce over 2,000 amps.

Furthermore, solar panels having arrayed solar cells electrically connected in accordance with the present invention may in particular be effectively sited within power line easement, and directly below high tension power lines where, by definition, the solar panels are often partially shaded by the overhead power lines, and by the power poles or towers.

1. A Solar Panel

In its most general form the present invention is embodied in a solar panel having a multiplicity of solar cells. The solar cells are organized as a number of groups of two or more of solar cells in each group, with all solar cells of each group connected in electrical parallel. Then the groups are connected in electrical series.

By this construction a voltage between a positive output terminal and a negative output terminal of the solar panel is substantially maintained regardless that, due to a shadow or physical obstruction, and a resulting low current output of some solar cell or cells within the parallel-connected cells of a group, the current of that particular group should be less than the current of another group in which no solar cells are partially obscured nor are producing a low current.

The solar panel so configured and connected exhibits improved immunity to reduced current output resultant to any partial obstruction, and resulting low current output(s), of one of more solar cells that are within the solar panel.

2. A Regular Grid Array of Solar Cells Electrically Connected as a Solar Panel Accordingly, in another of its aspects the present invention is embodied in a solar panel having a multiplicity of solar cells in a regular grid array. Namely, the solar panel has n rows of m solar cells.

The cells constituting each row are wired in parallel. The rows are wired in series and an equalizing network causes the voltage across each row to be substantially equal to the voltage across every other row. Since equal voltage is a hallmark of parallel connection, this voltage equalized series connection is referred to as a virtual parallel connection. The end result is that the voltage across each cell in the panel is substantially equal to the voltage across every other cell in the panel, but the voltage presented at the panel terminals is n times the voltage on any cell, and the current presented at the aforesaid terminals is the sum of all of the cell currents divided by n.

The equalizing network includes n-1 capacitors 1, 2, 3, . . . n-1 connected in electrical series. And also includes a network of switches. The switch network connects at one, first, time capacitor 1 across the parallel-connected cells of the 1st row, and capacitor 2 across the parallel-connected cells of the 2nd row, and so on until capacitor n-1 is connected across the parallel-connected cells of the [n-1]th row. The switch network connects at another, second, time capacitor 1 across the parallel-connected cells of the 2nd row, and capacitor 2 across the parallel-connected cells of the 3rd row, and so on until capacitor n-1 is connected across the parallel-connected cells of the nth row.

By this connecting of the switch network the voltage across each of the n-1 electrically-series-connected capacitors is substantially equal to the voltage across a neighboring capacitor. Since voltages that are substantially equal by pairs are all substantially equal to each other, the voltage between the positive output terminal of the solar panel and the negative output terminal is substantially maintained as n times the essentially equal voltage across each, and every, of the n-1 capacitors. This is true regardless that, due to a shading or physical blockage and a resulting low current output of some solar cell or cells within the parallel-connected cells of a row, the current of that particular row should be less than the current of another row in which no solar cells are shaded nor producing a low current.

The solar panel so configured and connected thus exhibits improved immunity to reduced current output resultant to the obstruction, and low current output(s), of one of more solar cells that are within the solar panel.

In the solar panel the switch network preferably includes break-before-make form-C electronic switches. A control circuit synchronously changes the switching state of all the break-before-make form-C electronic switches, preferably at a high frequency, and more preferably at a frequency greater than or equal to 1 kilohertz.

The overall effect of the establishing and of the first and the second connecting is to cause a direct current steady state voltage across each row of parallel-connected solar cells to be substantially equal.

Because equal voltage is an essential quality of a parallel electrical connection, a connection so realized is referred to as a virtual parallel connection of the n rows of solar cells in the panel of n×m solar cells. It may thus also be described that solar cells within a row are connected in parallel in the usual way, while the n rows, connected in series and voltage equalized, exhibit the equal voltage characteristic of parallel connection and are said to be in virtual parallel connection. Thus the solar panel employs both parallel and also (virtual) parallel connection of its arrayed solar cells.

The establishing of an equalizing network of switched capacitors preferably uses break-before-make form-C electronic switches. Moreover, these break-before-make form-C electronic switches are preferably driven by a control circuit to change a state of all of the switches in synchronism. Moreover, this control circuit preferably causes the change a state of all of the switches in synchronism, and at a high frequency. Indeed, the synchronous change a state of all of the switches is preferably at a frequency greater than or equal to 1 kilohertz.

These and other aspects and attributes of the present invention will become increasingly clear upon reference to the following drawings and accompanying specification.

BRIEF DESCRIPTION OF THE DRAWINGS

So that those having ordinary skill in the art to which the disclosed system and method pertains will more readily understand how to employ and use the same, reference may be had to the drawings wherein as follows.

DESCRIPTION OF THE PREFERRED EMBODIMENT

Figure 1:
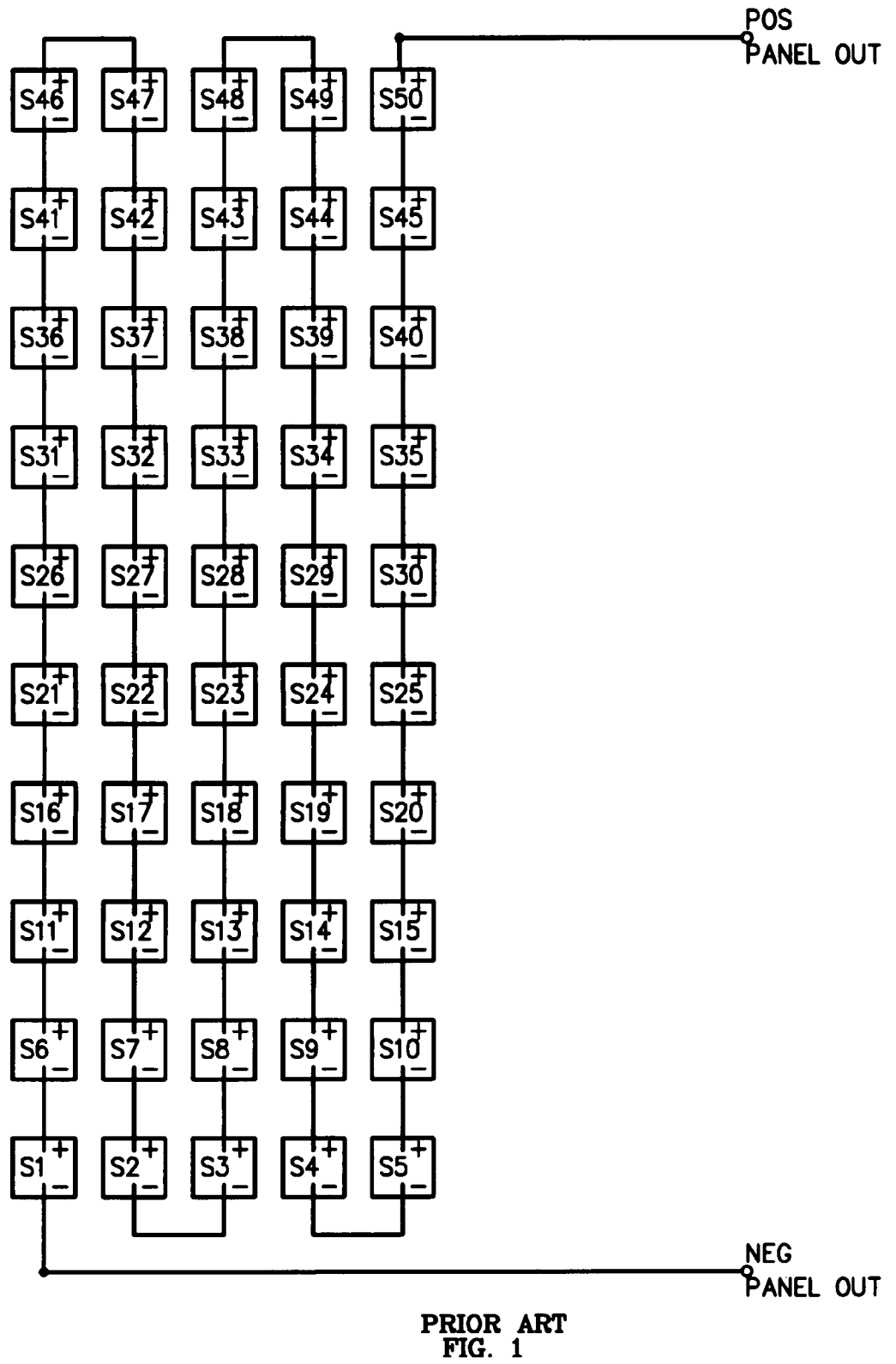
FIG. 1 is a diagrammatic representation showing a prior art panel of silicon solar cells connected all in series.

Referring now to FIG. 1, a diagrammatic representation showing a prior art panel of silicon solar cells S1-S50 all electrically connected in series is shown. This panel will have an open circuit (zero current) voltage output of approximately 30 volts and a fully loaded an fully illuminated voltage output of approximately 24 volts and current output of 7.5 amps, resulting in a rated power output of 180 watts.

If the panel shown in FIG. 1 were to be connected and fully illuminated and delivering 180 watts into a 24V bus, and if only one of the 50 cells was then to suddenly become 50% shaded, then the output current into the 24V bus would suddenly drop from 7.5 amps to 3.75 amps, and the power delivered would be only 90 watts. This 50% shading, or more, is common, as when the illustrated solar panel is situated below power lines casting shadows, or when a leaf or a bird alights upon one or more of the solar cells S51-S100. The considerable fall-off in voltage, and in power, do to such a common occurrence is not desirable. The present invention deals with this limitation, and this problem.

Figure 2:
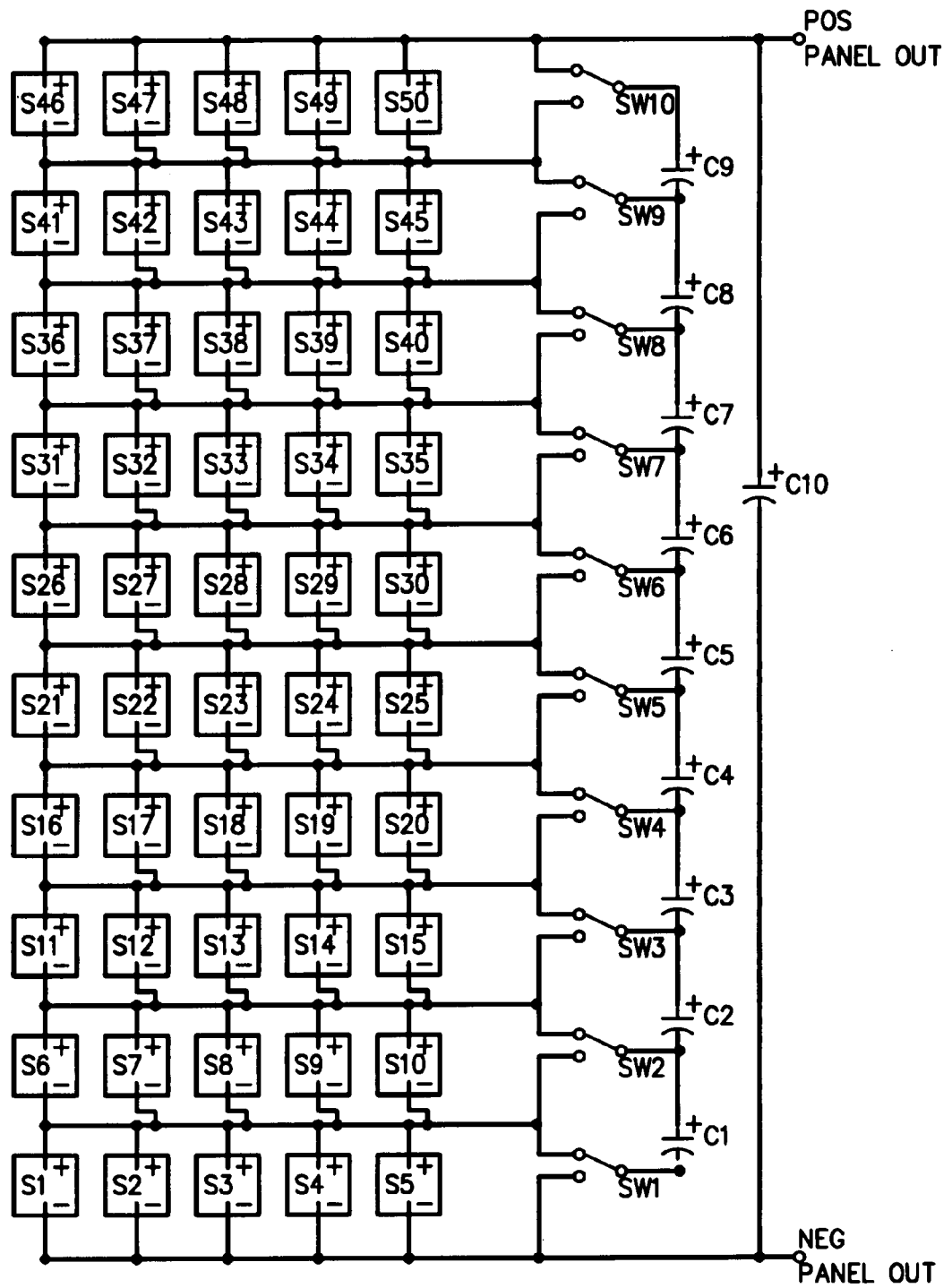
FIG. 2 is a diagrammatic representation showing the same number of silicon solar cells as in FIG. 1 interconnected in accordance with the present invention.

A solar panel with accompanying virtual parallel connection circuit in accordance with the present invention is shown in a top-level diagrammatic representation in FIG. 2. A detail schematic diagram of (1) an exemplary solar panel, and accompanying (2) virtual parallel connection circuit in accordance with the present invention, is shown in FIG. 3.

Referring now to FIG. 2, a diagrammatic representation of (1) the same 50 silicon solar cells—still identified as S1-S50—as were previously seen as solar cells S1-S50 in FIG. 1, along with (2) new panel wiring in accordance with the present invention, is shown. The solar cells in any one row, for example first-row solar cells S1-S5, are wired in parallel and the rows are wired in series with an equalizing network: This equalizing network is illustrated in FIG. 2 as relay contacts SW1-SW10, and accompanying associated capacitors C1-C10. The equalizing network is actually implemented as electronic switches which will be seen in greater detail in FIG. 3, where both operation and function of this equalizing network will also be explained in greater detail.

The open circuit output of the panel shown in FIG. 2 is approximately 6 volts, and the fully loaded and illuminated output voltage of approximately 4.8 with an output current of 37.5 amps, resulting in a rated power output of 180 watts. If the panel shown in FIG. 2 (and also in FIG. 3) were to be connected and fully illuminated and delivering 180 watts into a 4.8V bus, and if only one of the 50 cells was to suddenly become 50% shaded, then the output current into the 24V bus would suddenly diminish from 37.5 amps to fully 99% of 3.75 amps, or 37.125 amps while the power delivered would still be 178.2 watts.

Figure 3A:
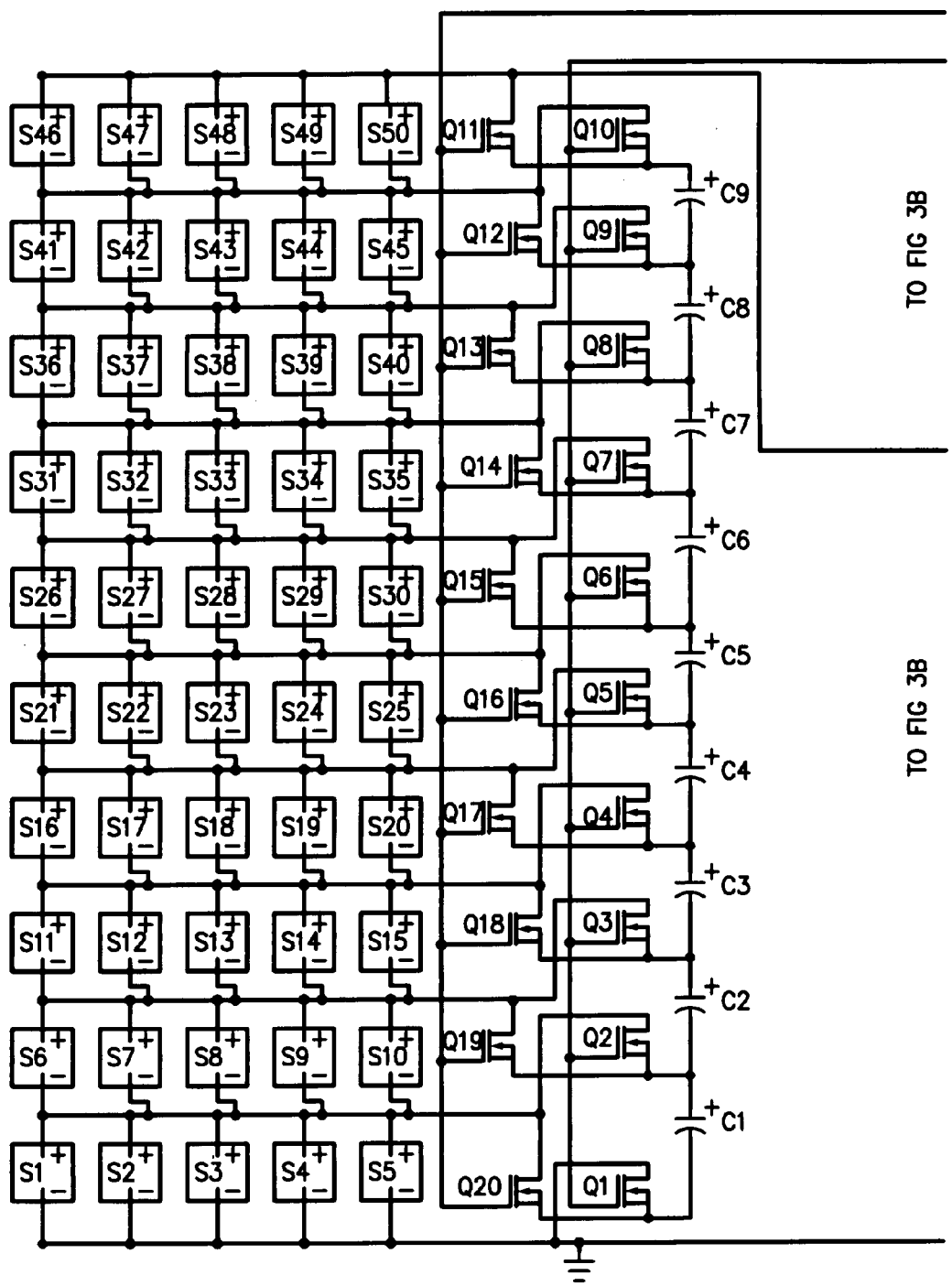
FIG. 3, consisting of FIGS. 3a and 3b, is a detail schematic diagram of (1) an exemplary solar panel, and accompanying (2) parallel and virtual parallel connection circuit, in accordance with the present invention.
Figure 3B:
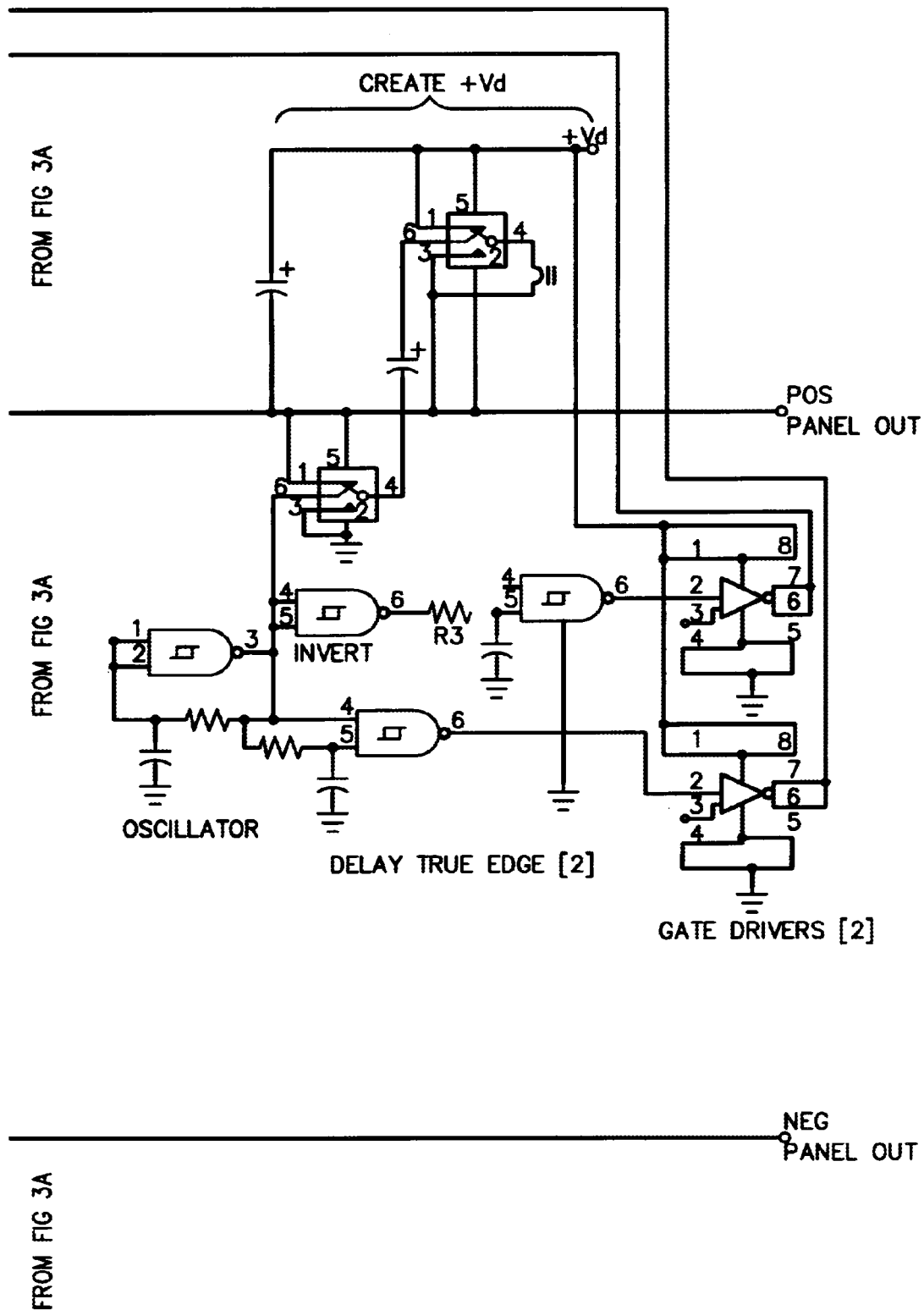

A detail schematic diagram of the exemplary solar panel previously seen in FIG. 2, with its included parallel and virtual parallel connection circuit in accordance with the present invention now being shown in detail, is shown in FIG. 3, consisting of FIGS. 3a and 3b.

Referring again to FIG. 3, the typical panel of fifty silicon solar cells S1-S50 particularly shown in FIG. 3a consists of an array of cells with ten rows of five, and five columns of ten. All of the cells in each row—for example a first row of solar cells S1-S5—are directly connected in electrical parallel.

All of the rows of solar cells in the panel are first connected in series, and then the output of each row is switched by associated pairs of transistors Q1-Q20 into associated ones of capacitors C1-C9. The transistors Q1-Q20 and the capacitors C1-C9 collectively constitute an equalizing network. Each electronic switch is preferably a break-before-make form-C switch, and is more preferably a pair of MOSFETs, as illustrated. A control circuit, shown in FIG. 3b and discussed below, changes the state of all of the switches S1-S20 in synchronism at a high frequency, typically 10 kilohertz. This has the effect of connecting each of the capacitors C1-C9 first across one row, next across another.

The overall effect of this switching is to cause the DC steady state voltage across each row to be substantially equal. Because this equal voltage is an essential quality of a parallel connection, this is referred to as a virtual parallel connection of the rows in the panel.

Referring further to FIG. 3a, the same array of fifty silicon solar cells S1-S50 as in FIG. 2 is shown, but the switches SW1-SW10 are now shown as N-channel Metal Oxide Semiconductor Field Effect Transistors (MOSFETs) Q1-Q20. An exemplary control circuit is shown with stages identified by function in FIG. 3b. A constant reference created in CREATE +Vd powers an OSCILLATOR that acts both directly and inverted thorough a DELAY TRUE EDGE [2] circuit to provide a high frequency switching signal to the GATE DRIVERS [2] which produces the switching signals to the MOSFETs Q1-Q20.

In accordance with the preceding explanation, variations and alterations of the circuit of the present invention will suggest themselves to a practitioner of the electronic design arts. For example, the solar panel need not be a regular nxm array. For example, switching can be realized by other means than relays and MOSFETs.

Accordingly, the scope of the present invention should be judged by the following claims, only, and not solely in accordance with those embodiments in which the invention has been taught.

What is claimed is:

1. A solar panel comprising:
   n groups of cells with m solar cells in each group, with all m solar cells in each group electrically connected in parallel, and all n groups of cells electrically connected in series between a positive output terminal and a negative output terminal of the panel, with n being a positive integer greater than 2 and m being a positive integer;
   an array of n-1 capacitors connected in electrical series; and
   an array of switches;
   wherein in a first configuration, a first capacitor of the array of n-1 capacitors is connected across the first group of cells, the first group of cells having a negative terminal that is the negative output terminal of the panel, and a second capacitor of the array of n-1 capacitors is connected across the second group of cells, and likewise for the remaining capacitors and groups of cells until an n-1th capacitor of the array of n-1 capacitors is connected across the n-1th group of cells;
   wherein in a second configuration, the first capacitor is connected across the second group of cells, the second capacitor is connected across the third group of cells, and likewise for the remaining capacitors and groups of cells until the n-1th capacitor is connected across an nth group of cells, the nth group of cells having a positive terminal that is the positive output terminal of the panel;
   wherein the array of switches is configured to switch between the first configuration and the second configuration; and
   wherein by repeated connection of the array of n-1 capacitors in the first configuration and in the second configuration, each of the capacitors is charged to a voltage substantially equal to the voltage across a neighboring capacitor, and since voltages that are substantially equal by pairs are all substantially equal to each other, the voltage between the output terminals of the panel is continuously substantially equal to n times the equal voltage across each of the parallel connected groups, regardless of the obstruction of any small number of cells in the panel.

2. The solar panel according to claim 1, wherein the array of switches comprises break-before-make form-C electronic switches.

3. The solar panel according to claim 2, wherein the electronic switches comprise MOSFETs.

4. The solar panel according to claim 2, further comprising a control circuit that generates a drive signal, wherein the break-before-make function of the electronic switches is generated by delaying true-going edges of the drive signal.

5. The solar panel according to claim 2, further comprising a control circuit that synchronously changes the state of all the break-before-make form-C electronic switches.

6. The solar panel according to claim 5, wherein the control circuit synchronously changes the state of all the break-before-make form-C electronic switches at a high frequency.

7. The solar panel according to claim 6, wherein the control circuit synchronously changes the state of all the break-before-make form-C electronic switches at a frequency greater than or equal to 1 kilohertz.

8. A solar cell circuit comprising:
   n rows of solar cells, wherein the n rows of solar cells are configured as a solar panel connected to a load, wherein the solar cells in each row of solar cells are electrically connected in parallel, and wherein n is a positive integer greater than 2;
   n-1 capacitors connected in electrical series; and
   a network of switches
   wherein in a first configuration, a first capacitor of the n-1 capacitors is connected across the first row of solar cells, a second capacitor of the n-1 capacitors is connected across the second row of solar cells, and likewise for the remaining capacitors and rows of solar cells until an n-1th capacitor of the n-1 capacitors is connected across the n-1th row of solar cells;
   wherein in a second configuration, the first capacitor is connected across the second row of solar cells, the second capacitor is connected across the third row of solar cells, and likewise for the remaining capacitors and rows of solar cells until the n-1th capacitor is connected across the nth row of solar cells; and
   wherein the network of switches is configured to switch between the first configuration and the second configuration.

9. The circuit according to claim 8, wherein the network of switches comprises break-before-make form-C electronic switches.

10. The circuit according to claim 9, wherein the electronic switches comprises MOSFETs.

11. The circuit according to claim 9, further comprising a control circuit that generates a drive signal, wherein the break-before-make function of the electronic switches is generated by delaying true-going edges of the drive signal.

12. The circuit according to claim 9, further comprising a control circuit that synchronously changes the switching state of all the break-before-make form-C electronic switches.

13. The circuit according to claim 12, wherein the control circuit synchronously changes the state of all the break-before-make form-C electronic switches at a high frequency.

14. The circuit according to claim 13, wherein the control circuit synchronously changes the state of all the break-before-make form-C electronic switches at a frequency greater than or equal to 1 kilohertz.

15. A method of equalizing voltages across n rows of solar cells connected in series between a negative output terminal and a positive output terminal of a solar panel in which each of the n rows of solar cells comprises m parallel-connected solar cells, the method comprising:
   activating a network of switches in a first configuration during a first time interval in a pair of time intervals to connect a first capacitor in an array of n-1 series-connected capacitors connected across the solar cells of a first row of solar cells, to connect a second capacitor of the array of n-1 capacitors across the solar cells of a second row of solar cells, and likewise for the remaining capacitors and rows of solar cells so that an n-1th capacitor of the array of n-1 capacitors is connected across the solar cells of an n-1th row of solar cells;

activating the network of switches in a second configuration during a second time interval in the pair of time intervals to connect the first capacitor across the solar cells of the second row of solar cells, to connect the second capacitor across the solar cells of a third row of solar cells, and likewise for the remaining capacitors and rows of cells so that the n-1th capacitor is connected across the solar cells of an nth row of solar cells; and repeatedly activating the network of switches alternately between the first configuration and the second configuration in subsequent pairs of time intervals to charge each of the n-1 capacitors to a voltage substantially equal to the voltage across a neighboring capacitor, thereby causing the voltage between the negative output terminal and the positive output terminal of the panel to be continuously substantially equal to n times the substantially equal voltages across each of the groups of cells, regardless of the obstruction of a small number of cells in the panel.

* * * * *